United States Patent [19]

Mai et al.

[11] 4,445,266

[45] May 1, 1984

[54] MOSFET FABRICATION PROCESS FOR REDUCING OVERLAP CAPACITANCE AND LOWERING INTERCONNECT IMPEDANCE

[75] Inventors: Chao C. Mai, Dallas; William M. Whitney, Plano; William M. Gosney, McKinney; Donald J. Gulyas, Sanger, all of Tex.

[73] Assignee: Mostek Corporation, Carrollton, Tex.

[21] Appl. No.: 290,833

[22] Filed: Aug. 7, 1981

[51] Int. Cl.³ .................. H01L 21/22; H01L 21/28
[52] U.S. Cl. ....................... 29/571; 29/578; 29/591; 148/187
[58] Field of Search .............. 29/571, 578, 591; 148/187

[56] References Cited

U.S. PATENT DOCUMENTS

| | | | |
|---|---|---|---|
| 3,881,242 | 5/1975 | Nuttall et al. | 148/175 X |
| 3,898,105 | 8/1975 | Mai et al. | 148/1.5 |
| 4,080,719 | 3/1978 | Wilting | 29/571 |
| 4,125,854 | 11/1978 | McKenny et al. | 357/41 |
| 4,179,311 | 12/1979 | Athanas | 148/187 X |
| 4,290,185 | 9/1981 | McKenny et al. | 29/571 |
| 4,305,200 | 12/1981 | Fu et al. | 29/571 |

*Primary Examiner*—G. Ozaki

[57] ABSTRACT

A method of forming a plurality of interconnected metal oxide semiconductor field effect transistors on P-type semiconductor substrate (10). A layer of oxide (14) is formed on the substrate (10) and then a polysilicon layer (16) is formed on top of the oxide layer (14). A layer of silicon nitride (18) is deposited on top of the polysilicon layer (16). The silicon nitride layer (18), polysilicon layer (16) and oxide layer (14) are selectively etched to form a conductor pattern. The conductor pattern defines a gate electrode and a plurality of interconnecting lines (42) that interconnect transistors to each other and to the peripheral circuits that drive the transistors. The source and drain regions (26 and 28) are ion implanted with arsenic ions. The exposed sidewalls of the polysilicon layer (16) are oxidized lateral and subjacent to the silicon nitride layer (18). The oxidation forms a lateral band of oxide (32) on the polysilicon layer (16) and effectively reduces the conductive width of the polysilicon layer (16). The reduced conductive width reduces the overlap capacitance. The silicon nitride layer (18) is then removed and a layer of tungsten (34) is deposited by hot-wall, low-pressure chemical vapor deposition (LPCVD). The tungsten layer (34) selectively adheres to the polysilicon layer (18) providing a low resistance path for the conductors. The tungsten layer (18) forms both a gate electrode and the low resistance interconnect lines (42) or "runs." A heat treatment may then be applied to the combined tungsten layer (34) and the polysilicon layer (16) to form a composite conductor of tungsten silicide. Thereafter the interconnect lines (42) and gate electrodes are covered by a low temperature oxide (36).

30 Claims, 7 Drawing Figures

MOSFET FABRICATION PROCESS FOR REDUCING OVERLAP CAPACITANCE AND LOWERING INTERCONNECT IMPEDANCE

TECHNICAL FIELD

The present invention pertains to the manufacture of integrated circuits and in particular to the manufacture of metal oxide semiconductor field effect transistors (MOSFET).

BACKGROUND OF THE INVENTION

Metal oxide semiconductor field effect transistors (MOSFET) have seen increased use in recent years in very large scale integrated circuits (VLSI). MOSFET integrated circuits provide high component density and simple process technology as compared with bipolar integrated circuits. High density MOSFET technology is particularly applicable for memory circuits.

As integrated circuit density increases, the number of transistors connected to a single extended signal line can increase substantially. For example, in a memory circuit the number of memory cells connected to a word line can increase by as much as a factor of four in progressing from a 16K device to a 64K device. Each interconnecting line, or "run" as it is more typically called, is normally driven by a peripheral circuit such as a decoder in a memory.

In certain applications it is necessary to simultaneously apply a signal to a plurality of transistor gates connected along a single run. The signal transmitted along a run is subject to time delay and distortion due to the series resistance of the run coupled with the effective shunt capacitance of the combination of all of the interconnected transistor gates that are attached to the run but are not conducting. However, when it becomes necessary for a transistor near a signal generating circuit to receive a signal simultaneously with a transistor far from the signal generating circuit, the delay along the run can degrade the performance. The series resistance of the run is a function of the length to width ratio of the run and the type of material utilized. As geometries become smaller, and run lengths stay essentially the same, the length to width ratio increases, thus increasing the series resistance at the run. Shunt capacitance of a run is primarily due to the capacitance of the conductive surface area of the gate electrode separated by the source and drain regions by the insulating gate oxide. Although the shunt capacitance decreases proportionately with the size of the gate electrode, the shunt capacitance increases as the gate oxide thickness is reduced. As the density of MOSFET circuits has increased, the gate oxide thickness has decreased from approximately 800 to 1,000 angstroms with 16K memories to a thickness of approximately 300 to 500 angstroms with current 64K memories. It can therefore be seen that the resistance and capacitance of runs is tending to increase with higher densities.

In applications where it is necessary to drive one transistor on the end of a long run of parallel transistors, the equivalent circuit of the run appears as a distributed capacitor. This distributed capacitor is made up of a plurality of series R/shunt C L-sections. The series R is a function of the length of the run between adjacent transistors while the shunt C is the capacitance due to the conductive surface area of the gate electrodes that overlies the source and drain areas of each individual transistor. When considering a high density circuit such as a 64K static random access memory (RAM), each row can have 256 transistors in parallel with an individual run. This results in 255 idle transistors loading the run when the furthermost transistor is driven. Each of the series R/shunt C L-sections has an associated R-C time constant, which, when added together, results in a delay that places a limitation on the maximum switching speed at which the circuit may operate.

Heretofore the conventional process for fabricating runs comprises depositing and etching a plurality of polycrystalline silicon (polysilicon) lines. These polysilicon lines are then doped with impurities to increase their conductivity. The typical values for series resistance of doped polysilicon lines is 25 to 50 ohms per square. A square is defined as an area of conductor of uniform thickness with equal side dimensions wherein the series resistance for a 1"×1" square is the same as for a 0.001"×0.001" square.

The conventional process for fabricating a MOSFET transistor includes the steps of depositing, patterning and etching a layer of polysilicon to define a conductive gate electrode over the channel region of a transistor. Impurities are then introduced into the gate and substrate on either side of the gate electrode to define the source and drain regions of the transistor. Ion implantation has been used to substantially improve the definition of the boundaries for the source and drain regions are compared to vapor deposition techniques. However, there remains some lateral diffusion of impurities under the gate electrode causing the conductor portions of the source and drain regions to "creep" under the gate electrode. A virtual capacitor is formed in this process by the overlap of the gate electrode and either the source or drain region separated by the gate oxide layer which provides the dielectric of the capacitor. The extent of lateral diffusion of impurities under the gate electrode remains essentially constant regardless of circuit density due to the nature of ion implantation.

In view of the time delay problems caused by the increasing resistance and capacitance of runs in integrated circuits resulting from smaller geometries and higher densities, there exists a need for a method for fabricating such runs to have less resistance and capacitance.

SUMMARY OF THE INVENTION

A selected embodiment of the present invention is a method for fabricating a conducting structure on a semiconductor substrate. The method includes the following steps. An insulating layer is formed on the semiconductor substrate and a first conducting layer is then formed on the insulating layer. Thereafter an oxidation resistant layer is formed on the first conducting layer. Next, the oxidation resistant, first conducting and insulating layers are selectively etched in a pattern to define a plurality of conducting paths wherein the sidewalls of the first conducting layer are exposed. The exposed sidewalls are then selectively oxidized such that only a portion of the first conducting layer is oxidized thereby reducing the conductive width of the first conductive layer. The oxidation resistance layer is then removed from the first conducting layer and a second conducting layer is selectively deposited on the first conducting layer. The second conducting layer selectively adheres to the non-oxidized portion of the first conducting layer and the second conducting layer has a higher conductivity than the first conducting layer thereby defining a primary conducting path. A protective layer is then formed over the second conducting layer. The process is then completed by contact etching and metallization.

BRIEF DESCRIPTION OF THE DRAWINGS

For a more complete understanding of the present invention and the advantages thereof reference is now made to the following description taken in conjunction with the accompanying drawings in which.

DETAILED DESCRIPTION OF THE INVENTION

Figure 1:
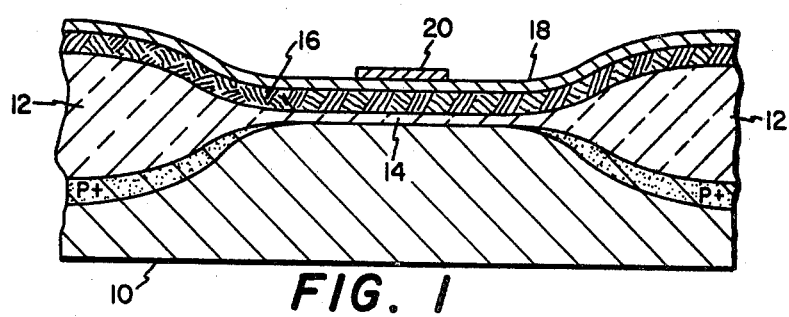
FIGS. 1–5 are elevational views, in section, of a substrate depicting progressive steps in a fabrication process.

Referring to FIG. 1, there is shown a P-type semiconductor substrate 10 which has had a field oxide 12 formed in a process which is well known in the art and, for example, described in U.S. Pat. No. 4,179,311. Following a surface cleaning step, a "channel" oxide or "gate" oxide layer 14 is grown to a thickness of about 300 to 500 angstroms. During the process of growing the gate oxide 14, the thickness of the field oxide 12 is slightly increased wherein the gate oxide 14 merges with the field oxide 12. This is followed by an ion implantation step to adjust the threshold voltage in the active areas using known techniques. Either an enhancement mode or a depletion mode FET may be produced depending on the ion conductivity type and dosage level used. The process of implantation is described in U.S. Pat. No. 3,898,105 which is incorporated by reference herein.

A polycrystalline silicon (hereinafter polysilicon) layer 16 is deposited on the gate oxide 14 and field oxide 12 to a thickness of about 1,000 angstroms to 2,000 angstroms using a low pressure chemical vapor deposition in a hot wall furnace. It should be understood that this is substantially less than a normal deposition thickness of about 5,000 angstroms. The polysilicon layer 16 will provide a means for forming the first layer of the gate conductor of a metal oxide semiconductor field effect transistor (MOSFET) and the interconnect lines by subsequent processing to be described below. A pure polysilicon layer normally has a resistance of $10^6$ to $10^9$ ohms per square. It should be understood that the original term "insulated gate field effect transistor" (IGFET) has been replaced with MOSFET, even though polysilicon is used rather than a metal.

Heretofore, MOSFET fabrication has utilized a step whereby the polysilicon layer was doped with impurities of the same type used in the source and drain wherein the resistance of the polysilicon layer was reduced to 20 to 50 ohms per square. This step provided a method for forming relatively low resistance interconnects (hereinafter "runs") between transistors in close proximity.

In this invention, a layer of silicon nitride 18 is deposited on the polysilicon layer 16. The silicon nitride layer 18 has properties that make it resistant to oxidation steps which are described below.

Figure 2:
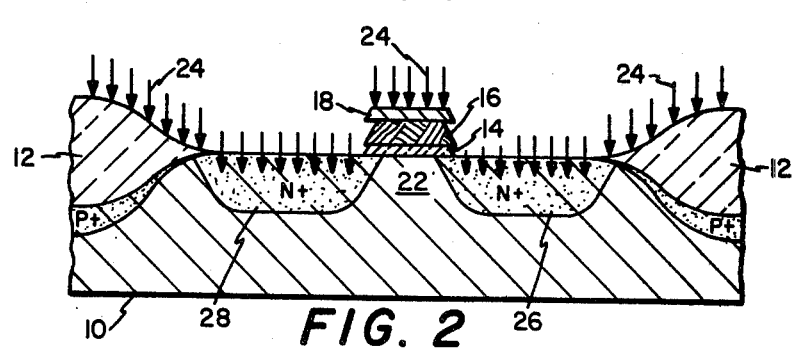

Next, the length of the channel region of the transistor is defined by a layer of photoresist 20 whereby the gate oxide layer 14, the polysilicon layer 16 and the silicon nitride layer 18, not covered by the photoresist 20, are subjected to a plasma etch to produce the structure shown in FIG. 2. As each layer is etched, the lateral edges will slant due to the etching process itself, forming an overall trapezoidal shape for each layer in cross section. The width of the channel region has been defined in a previous step (not shown) wherein the active area is formed. It should be understood that the runs that connect the transistors are also defined by the photoresist 20 although they are not shown.

Figure 3:
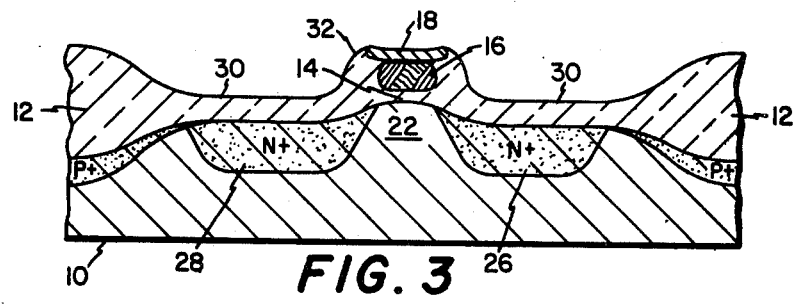

Now referring to FIG. 2, the photoresist 20 is removed, leaving the silicon nitride layer 18 and the polysilicon layer 16 that define the channel region 22 of the transistor. An ion implantation step is then performed, as indicated by the arrows 24, wherein the surface is bombarded by arsenic ions with sufficient velocity such that the arsenic ions will implant into the P-type substrate 10 thus defining a source region 26 and a drain region 28 as shown in FIG. 3. The gate oxide layer 14 was removed from the source region 26 and the drain region 28 to allow the arsenic ions to enter the silicon, as arsenic ions will not sufficiently penetrate the gate oxide 14. It should be understood that the gate oxide layer 14 does not have to be removed if ions with sufficient penetrating properties are employed such as, for example, phosphorus ions.

The remaining polysilicon layer 16 and silicon nitride layer 18 act as a mask to define the boundaries for the channel region 22 of the transistor. Normally, the polysilicon layer 16 would have been doped with N-type impurities during the ion implant step, thus lowering its resistance, whereby the polysilicon layer 16 would act as a gate conductor. In the present invention, the polysilicon layer 16 is used primarily as a template for depositing conductive material as described below. The silicon nitride layer 18 serves to prevent the arsenic ions from penetrating into the polysilicon layer 16.

Although ion implantation provides good boundary definition for the source and drain regions 26 and 28, there will be some lateral diffusion of the arsenic ions. This will cause a conductive area of the source and drain regions to extend under the gate oxide layer 14. If the polysilicon layer 16 were doped then the conductive area of the polysilicon layer 16 would overlap the edges of the source and drain regions 26 and 28. Layer 16 would then be separated only by the gate oxide 14, thus increasing the gate-to-source and drain capacitance. One of the important aspects of the present invention is to reduce this overlap capacitance.

Now referring to FIG. 3, the substrate 10 is exposed to a steam oxidation step at a temperature of approximately 900° C. for a sufficient period of time to laterally oxidize a portion of the polysilicon layer 16 shown in FIG. 2. This oxidation consumes a portion of the polysilicon layer 16 to form non-conductive silicon dioxide, in addition to oxidizing all other exposed silicon. The oxidation also consumes the silicon that is a part of the source and drain regions 26 and 28, thus driving the implanted arsenic ions deeper into the silicon substrate 16. This forms an oxide coating 30 over the source and drain regions 26 and 28. Since the silicon nitride layer 18 is resistant to oxidation, the oxidation of the polysilicon layer 16 proceeds laterally and perpendicular to the sidewalls of the polysilicon layer 16. At the juncture of the lateral edges of the polysilicon layer 16 and the silicon nitride layer 18, there is a slight uplifting of the silicon nitride layer 18 due to the normal forces incurred in the oxidation process. The lateral edge of the gate oxide layer 14 is increased in thickness since both the polysilicon layer 16 and the silicon substrate 10 are consumed during oxidation. The result of this oxidation step is that a lateral band of oxide 32 is formed which has reduced the width of the polysilicon layer 16 while retaining the original thickness. There will essentially be a continuous oxide layer comprised of oxide layers 12, 14, 30 and 32. As noted above, the thickness of the polysilicon layer 16 is thinner than that used in the prior art processes. This facilitates a more controlled etching or patterning of the polysilicon layer 16.

Figure 4:
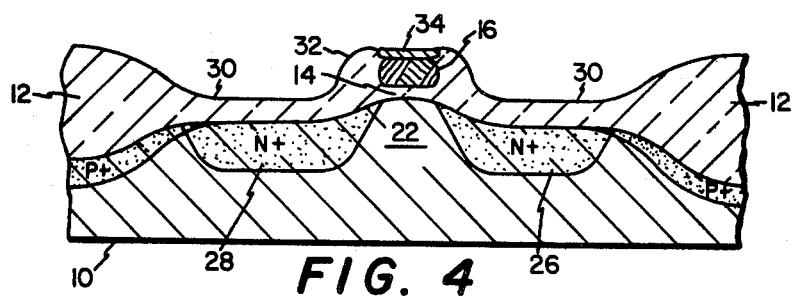

Next referring to FIG. 4, the silicon nitride layer 18 is removed from the polysilicon layer 16. A layer of tungsten 34, having a thickness of about 1,500 angstroms to 1,800 angstroms, is selectively deposited on the exposed surface of the polysilicon layer 16 using a conventional hot-wall, low-pressure chemical vapor deposition (LPCVD) technique. The chemical reaction parameters are selected such that deposition takes place preferentially on exposed silicon or polysilicon only, and no deposition takes place on the oxide layers 12, 30 and 32. Since the polysilicon layer 16 has a resistance of $10^6$ to $10^9$ ohms per square, the deposition of the tungsten onto the polysilicon layer 16 provides a low resistance strap of approximately 1 to 3 ohms per square over the channel region 22, thus forming the gate electrode of the transistor. This process also forms the low resistance runs as will be described below.

FIGS. 3 and 4 illustrate an important feature of the present invention. The silicon nitride layer 18 and the polysilicon layer 16 are deposited over the channel region 22 thereby forming a self-registering mask for ion implantation of the source and drain regions 26 and 28. This area is then reduced in width by lateral oxidation of the polysilicon layer 16. Since tungsten can be selectively deposited only on the nonoxidized portion of the polysilicon layer 16, after removal of the silicon nitride layer 18, the conductive area is effectively reduced in width. By retracting the edges of the polysilicon layer 16 away from the source and drain regions 26 and 28 the overlapping of the gate electrode, as defined by the tungsten layer 18, over the source and drain regions 26 and 28 is reduced resulting in reduced overlap capacitance. This results in lower delay times in the overall operation of the MOSFET circuit.

Figure 5:
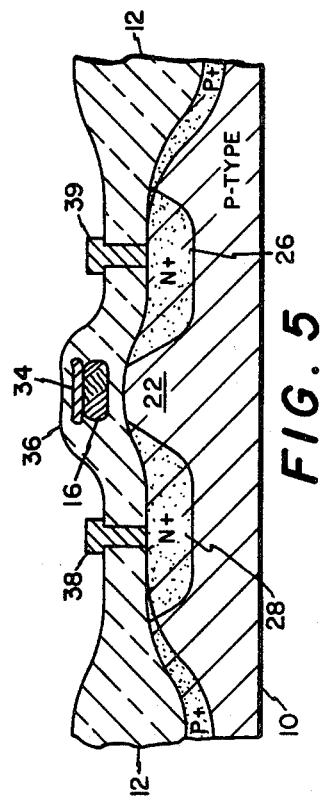

Now referring to FIG. 5 there is shown the final series of steps in processing the MOSFET circuit. The circuit is subjected to a low temperature plasma enhanced oxide deposition at about 400° C. wherein a protective oxide 36 is grown over the tungsten layer 34. Thereafter, contact windows are opened and metal source and drain contacts 38 and 39 are formed, preferably using aluminum deposition in a known manner. Although not shown, a pattern of aluminum runs can be deposited on the surface of the oxide layers 12 and 36 to interconnect a plurality of similar transistors. Oxide layer 36 insulates the tungsten layer 34 from any overlying conductors.

In another embodiment of the invention the tungsten layer 34 and the polysilicon layer 16 are subjected to a heat treatment that reduces the combined layers to a composite of tungsten silicide prior to deposition of the low temperature oxide layer 36. The conductivity of tungsten silicide and the composite of the tungsten and polysilicon layers are essentially the same.

Figure 6:
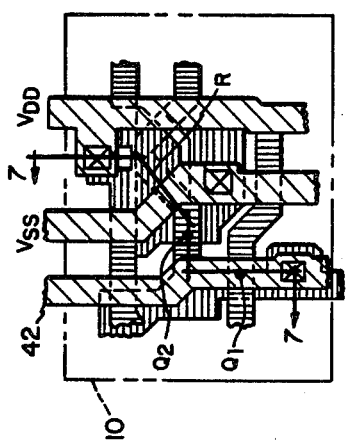
FIG. 6 is a plan view of a substrate layout of a plurality of MOSFET transistors.

Now referring to FIG. 6, there is shown a planar layout of a static random access memory of the type disclosed in U.S. Pat. No. 4,125,854 but using runs fabricated by the method of the present invention rather than doped polysilicon. A section is taken along line 7—7 which follows a typical run and is shown in FIG. 7.

Figure 7:
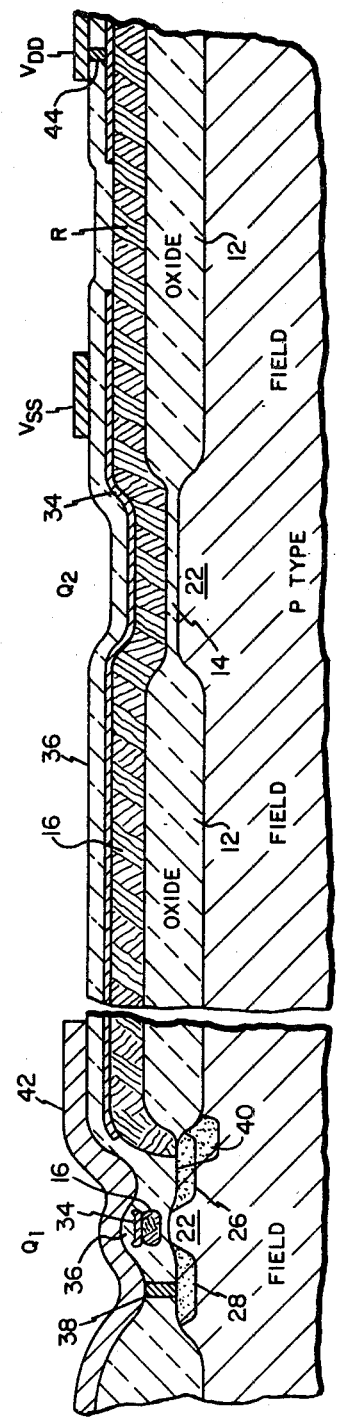
FIG. 7 is an elevational view, in section, taken along the line 7—7 of FIG. 6.

Referring to FIG. 7 in particular, there is shown a cross section of two similar transistors Q1 and Q2, wherein Q1 is shown in a cross section through the source and drain regions 26 and 28, and Q2 is shown in cross section through the channel 22 which is a perpendicular view to that of Q1. The polysilicon layer 16 traverses the field oxide layer 12 between the source region 26 of Q1 and the gate oxide layer 14 of Q2. The polysilicon layer 16 is fed through a contact window to a phosphorus implant 40. The tungsten layer 34 is deposited on the polysilicon layer 16 as described above to provide the low resistance runs to interconnect Q1 and Q2. The tungsten layer 34 will provide the primary conductive path for these runs. The tungsten layer 34 does not physically connect to the drain region 28 of Q1. The phosphorus implant 40 will slightly diffuse into the polysilicon layer 16 at the point of contact between the polysilicon layer 16 and the phosphorus implant 40 providing a slightly lower resistance path than pure polysilicon.

The polysilicon layer 16 can also be patterned to connect Q2 to a power supply line VDD through a resistor R. When the silicon nitride layer 18 of FIG. 3 is removed, it can be done selectively, which is not shown in the drawings, so as to leave a predetermined pattern of silicon nitride on the polysilicon layer 16 to form the resistor R. The tungsten layer 34 does not adhere to the silicon nitride layer 18 which results in the strip of undoped polysilicon between the openings in the tungsten layer 34 as shown by the letter R in FIG. 7. By breaking the conductive path of the tungsten layer 34 in a predetermined manner, a desired resistor value can be obtained utilizing the intrinsic impedance of the undoped polysilicon.

The layer of low temperature oxide 36 that is deposited over the tungsten layer 34 insulates the tungsten from the aluminum runs 42 that are sputtered on as described above. The contacts 38 and 44 connect the aluminum runs to the source region 26 and to VDD as shown in FIG. 7.

Although a preferred embodiment of the invention has been described in detail, it should be understood that various changes, substitutions and alterations can be made therein without departing from the spirit and scope of the invention as defined by the appended claims.

What is claimed is:

1. A method for fabricating a conducting structure for an integrated circuit comprising the steps of:
   forming an insulating layer on a semiconductor substrate;
   forming a polycrystalline silicon layer on said insulating layer, said layer having a propensity for oxidation;
   forming an oxidation resistant layer on said polycrystalline silicon layer;
   selectively etching said oxidation resistant layer, said polycrystalline silicon layer and said insulating layer in a pattern to define a plurality of conducting paths, said selective etching exposing the sidewalls of said first conducting layer;
   selectively oxidizing the exposed sidewalls of said polycrystalline silicon layer, said selective oxidation perpendicular to the sidewalls of said polycrystalline silicon layer and subjacent to said oxidation resistant layer such that only a portion of said polycrystalline silicon layer is oxidized wherein the width of said polycrystalline silicon layer is reduced;

removing said oxidation resistant layer;

forming a conducting layer on said polycrystalline silicon layer, said conducting layer adhering only to the nonoxidized portion of said polycrystalline silicon layer wherein the nonoxidized portion of said polycrystalline silicon layer defines a template for a primary conductor path, said conducting layer having a higher conductivity than said polycrystalline silicon layer, wherein said conducting layer forms said primary conductor path; and forming a protective layer over said conducting layer.

2. The method of fabricating a conducting structure as defined in claim 1 wherein the step of forming said insulating layer is comprised of the step of forming an oxide layer.

3. The method of fabricating a conducting structure as defined in claim 1 wherein the step of forming said oxidation resistant layer comprises the step of forming a silicon nitride layer.

4. The method of fabricating a conducting structure as defined in claim 1 wherein the step of forming said conducting layer comprises the step of forming a tungsten layer.

5. The method of fabricating a conducting structure as defined in claim 1 wherein the step of forming said protective layer comprises the step of growing a layer of low temperature oxide.

6. The method of fabricating a conducting structure as defined in claim 1 further comprising the step of applying a heat treatment after forming said conducting layer, said heat treatment combining said polycrystalline silicon layer and said conducting layer into a composite conducting layer.

7. The method of fabricating a conducting structure as defined in claim 1 wherein the step of removing said oxidation resistant layer comprises the step of selectively removing said oxidation resistant layer whereby a portion of said oxidation resistant layer will remain on said polycrystalline silicon layer to prevent adherance of said conducting layer to said first conducting layer over said portions thereby retaining the conductivity of polycrystalline silicon layer in said portion to form a series resistor.

8. A method for fabricating a conducting structure for an integrated circuit comprising the steps of:

forming an oxide layer on a semiconductor substrate;

forming a polycrystalline silicon layer on said oxide layer;

forming a silicon nitride layer on said polycrystalline silicon layer;

selectively etching said nitride and polycrystalline silicon layers in a pattern to define a plurality of conducting paths, said selective etching exposing the sidewalls of said polycrystalline silicon layer;

selectively oxidizing the exposed sidewalls of said polycrystalline silicon layer, said selective oxidation perpendicular to the sidewalls of said polycrystalline silicon layer and subjacent to said silicon nitride layer such that only a portion of said polycrystalline silicon layer is oxidized;

selectively removing said silicon nitride layer whereby portions of said silicon nitride layer remain on said polycrystalline silicon layer;

forming a tungsten layer on said polycrystalline silicon layer by hot wall low pressure chemical vapor deposition, said tungsten layer selectively adhering only to the exposed non-oxidized portion of said polycrystalline silicon layer wherein said non-oxidized portion of said polycrystalline silicon layer defines a primary conductor path, thereby reducing the conductive width of said polycrystalline silicon layer and said tungsten layer, wherein said tungsten layer forms said primary conductor path and said portions of said silicon nitride layer on said polycrystalline layer form a series resistor in said primary conductor path; and forming a layer of low temperature oxide over said tungsten layer.

9. A method for fabricating a conducting structure for an integrated circuit as defined in claim 8 comprising a further step of applying a heat treatement to said polycrystalline silicon and tungsten layers prior to forming said layer of low temperature oxide thereby forming a layer of tungsten silicide.

10. A method of forming a plurality of interconnected metal oxide semiconductor field effect transistors comprising the steps of:

forming an insulating layer on a semiconductor substrate;

forming a polycrystalline silicon layer having a propensity for oxidation;

forming an oxidation resistant layer on said polycrystalline silicon layer;

selectively etching said oxidation resistant layer, said polycrystalline silicon layer and said insulating layer in a pattern to define a plurality of channel regions for the plurality of transistors and a plurality of interconnects between said transistors and the peripheral circuits for driving said transistors wherein said selective etching also exposes the sidewalls of said polycrystalline silicon layer;

applying an ion implantation to form source and drain regions of the plurality of transistors in said silicon substrate, said source and drain regions on opposite sides of said channel regions, said oxidation resistant layer having sufficient thickness to obstruct said ion implantation in said first conducting layer;

selectively oxidizing the exposed sidewalls of said polycrystalline silicon layer, said oxidation extending perpendicular to the exposed sidewalls of said polycrystalline silicon layer and subjacent to said oxidation resistant layer such that only a portion of said polycrystalline silicon layer is oxidized wherein said oxidized portion loses its conductive properties thereby reducing the conductive surface area of said polycrystalline silicon layer structure at or near the edges of said source and drain regions resulting in reduced overlap capacitance;

removing the remaining portion of said oxidation resistant layer;

forming a conducting layer on said polycrystalline silicon layer, said second conducting layer selectively adhering to the nonoxidized portion of said polycrystalline silicon layer, said conducting layer having a higher conductivity than said polycrystalline silicon layer, said conducting layer forming both a gate electrode for each of the plurality of transistors over said channel regions and a plurality of low resistance interconnecting lines; and forming a layer of protective insulating material on said second conducting layer.

11. The method in claim 10 wherein the step of forming said insulating layer comprises the step of growing an oxide layer.

12. The method in claim 10 wherein the step of forming said oxidation resistant layer comprises the step of depositing a silicon nitride layer.

13. The method in claim 10 wherein the step of applying said ion implantation comprises the step of applying an ion implantation of arsenic ions.

14. The method in claim 10 wherein the step of forming said second conducting layer comprises the step of depositing a tungsten layer by hot-wall low-pressure chemical vapor deposition.

15. The method of claim 10 wherein the step of forming said protective insulating layer comprises the step of depositing a low temperature oxide.

16. The method of claim 10 further comprising the step of applying a heat treatment after forming said conducting layer, said heat treatment combining said first and second conducting layers into a composite conducting layer.

17. The method of claim 16 wherein said composite conducting layer comprises tungsten silicide.

18. The method of claim 10 wherein the step of removing said oxidation resistant layer comprises the step of selectively removing said oxidation resistant layer whereby a portion of said oxidation resistant layer will remain to prevent adherance of said conducting layer to said polycrystalline silicon layer over said narrow strip thereby retaining the conductivity of said polycrystalline silicon layer in said portion to form a series resistor.

19. A method of forming a plurality of interconnected metal oxide semiconductor field effect transistors comprising the steps of:

forming a layer of oxide on a semiconductor substrate;

forming a layer of polycrystalline silicon on said oxide layer;

forming a layer of silicon nitride on top of said polycrystalline silicon layer;

selectively etching said silicon nitride and polycrystalline silicon layers and said oxide layers in a pattern that defines a plurality of channel regions for the plurality of transistors and a plurality of interconnects between said transistors and the peripheral circuits for driving said transistors wherein said selective etching also exposes the sidewalls of said polycrystalline silicon layer;

applying an ion implantation of arsenic ions to form source and drain regions of the plurality of transistors in said semiconductor substrate, said source and drain regions on opposite sides of said channel region, said silicon nitride layer having sufficient thickness to obstruct said ion implantation in said polycrystalline silicon layer;

selectively oxidizing the exposed sidewalls of said polycrystalline silicon layer, said oxidation extending perpendicular to the exposed sidewalls of said polycrystalline silicon layer and subjacent to said silicon nitride layer such that only a portion of said polycrystalline silicon layer is oxidized thereby reducing the conductive surface area of said polycrystalline silicon layer at or near the edges of said source and drain regions resulting in reduced overlap capacitance;

selectively removing said silicon nitride layer whereby portions of said silicon nitride layer remain on said polycrystalline layer;

forming a tungsten layer by hot-wall, low-pressure chemical vapor deposition on said polycrystalline silicon layer, said tungsten layer selectively adhering to the exposed nonoxidized portion of said polycrystalline silicon layer, said tungsten layer forming a gate electrode for each of the plurality of transistors over said channel region and a plurality of low resistance interconnect lines, said portion of said polycrystalline silicon covered by said silicon nitride forming a resistor in series with said low resistance interconnect lines; and forming a layer of protective material by depositing a low temperature oxide on said tungsten layer.

20. The method in claim 19 comprising a further step of applying a heat treatment to the combination of said polycrystalline and tungsten layers prior to forming said layer of low temperature oxide thereby forming a layer of tungsten silicide.

21. A method of fabricating a metal oxide semiconductor field effect transistor comprising the steps of:

forming an insulating layer on a semiconductor substrate;

forming a polycrystalline silicon layer on said insulating layer, said layer having a propensity for oxidation;

forming an oxidation resistant layer on said polycrystalline silicon layer;

selectively etching said oxidation resistant layer, said polycrystalline silicon layer and said insulating layer in a pattern to define a channel region of the transistor and expose the sidewalls of said first conducting layer;

applying an ion implantation to form a source and drain region of the transistor in said silicon substrate, said source and drain region on opposite sides of said channel region, said oxidation resistant layer having sufficient thickness to obstruct said ion implantation in said first conducting layer;

selectively oxidizing the exposed sidewalls of said polycrystalline silicon layer, said oxidation extending perpendicular to the exposed sidewalls of said first conducting layer and subjacent to said oxidation resistant layer such that only a portion of said polycrystalline silicon layer is oxidized whereby said oxidized portion loses its conductive properties thereby reducing the conductive surface of said first conducting layer at or near the edges of said source and drain region resulting in reduced overlap capacitance;

removing remaining portion of said oxidation resistant layer;

forming a conducting layer on said first conducting layer, said second conducting layer having a higher conductivity than said polycrystalline silicon layer, said conducting layer selectively adhering to the non-oxidized portion of said polycrystalline silicon layer wherein a gate electrode of the transistor is formed; and forming a layer of protective insulating material on said second conducting layer.

22. The method in claim 21 wherein the step of forming said insulating layer comprises the step of growing an oxide layer.

23. The method in claim 21 wherein the step of forming said oxidation resistant layer comprises the step of depositing a silicon nitride layer.

24. The method in claim 21 wherein the step of applying said ion implantation comprises the step of applying an ion implantation of arsenic ions.

25. The method in claim 21 wherein the step of forming said conducting layer comprises the step of depositing a tungsten layer by hot wall chemical vapor deposition.

26. The method in claim 21 wherein the step of forming said protective insulating layer comprises the step of depositing a low temperature oxide.

27. The method in claim 21 further comprising the step of applying a heat treatment after forming said second conducting layer, said heat treatment combining said polycrystalline silicon layer and said conducting layer into a composite conducting layer.

28. The method in claim 27 wherein said composite conducting layer comprises tungsten silicide.

29. A method of fabricating a metal oxide semiconductor field effect transistor comprising the steps of:
    forming a layer of oxide on a semiconductor substrate;
    forming a layer of polycrystalline silicon on said oxide layer;
    forming a layer of silicon nitride on top of said polycrystalline silicon layer;
    selectively etching said silicon nitride, polycrystalline silicon and oxide layers in a pattern that defines a channel region of a transistor whereby the sidewalls of said polycrystalline layer are exposed;
    applying an ion implantation of arsenic ions to form a source and drain region of the transistor in said semiconductor substrate, said source and drain regions on opposite sides of said channel region, said silicon nitride having sufficient thickness to obstruct said ion implantation in said polycrystalline silicon layer;
    selectively oxidizing the exposed sidewalls of said polycrystalline silicon layer, said oxidation extending perpendicular to the exposed sidewalls of said polycrystalline silicon layer and subjacent to said silicon nitride layer such that only a portion of said polycrystalline silicon layer is oxidized thereby reducing the conductive surface area of said polycrystalline silicon layer at or near the edges of said source and drain region resulting in reduced overlap capacitance;
    forming a layer of tungsten by hot-wall low-pressure chemical vapor deposition on said polycrystalline silicon layer, said tungsten layer selectively adhering to the non-oxidized portion of said polycrystalline layer wherein a gate electrode is formed; and
    forming a layer of protective material by depositing a low temperature oxide on said tungsten layer.

30. The method in claim 29 further comprising the step of applying a heat treatment to the combination of said tungsten layer and said polycrystalline silicon layer to form a composite layer of tungsten silicide.

* * * * *